US012586632B2

(12) United States Patent
Hsieh et al.

(10) Patent No.: US 12,586,632 B2
(45) Date of Patent: Mar. 24, 2026

(54) SIGNAL RECEIVER, DATA RECEIVER AND DATA LATCH THEREOF

(71) Applicant: NANYA TECHNOLOGY CORPORATION, New Taipei City (TW)

(72) Inventors: Po-Chun Hsieh, Taoyuan City (TW); Hao-Huan Hsu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 280 days.

(21) Appl. No.: 18/481,224

(22) Filed: Oct. 4, 2023

(65) Prior Publication Data

US 2025/0118355 A1     Apr. 10, 2025

(51) Int. Cl.
| | |
|---|---|
| *G11C 11/00* | (2006.01) |
| *G11C 11/4076* | (2006.01) |
| *G11C 11/4093* | (2006.01) |
| *H03K 3/037* | (2006.01) |
| *H03K 17/56* | (2006.01) |
| *H04L 25/03* | (2006.01) |
| *H03K 19/20* | (2006.01) |

(52) U.S. Cl.
CPC ...... *G11C 11/4093* (2013.01); *G11C 11/4076* (2013.01); *H03K 3/037* (2013.01); *H03K 17/56* (2013.01); *H04L 25/03057* (2013.01); *H03K 19/20* (2013.01)

(58) Field of Classification Search
CPC . G11C 11/4093; G11C 11/4076; H03K 3/037; H03K 17/56; H03K 19/20
See application file for complete search history.

(56) References Cited

U.S. PATENT DOCUMENTS

| | | | | |
|---|---|---|---|---|
| 6,529,993 | B1 * | 3/2003 | Rogers | G11C 7/1078 |
| | | | | 365/194 |
| 7,327,766 | B2 * | 2/2008 | Stief | G11C 29/12015 |
| | | | | 370/537 |

(Continued)

FOREIGN PATENT DOCUMENTS

| | | |
|---|---|---|
| CN | 115206364 | 10/2022 |

OTHER PUBLICATIONS

"Office Action of Taiwan Counterpart Application", issued on Feb. 17, 2025, p. 1-p. 6.

(Continued)

*Primary Examiner* — Pho M Luu
(74) *Attorney, Agent, or Firm* — JCIPRNET

(57) ABSTRACT

A signal receiver includes a data receiver and a data strobe signal receiver. The data receiver includes a plurality of current mode logic circuits and a plurality of data latches. A first stage current mode logic circuit receives a data signal, and a final stage current mode logic circuit outputs an amplified data signal. The plurality of data latches receive the amplified data signal, wherein each of the data latches sums the amplified data signal and a plurality of feedback data to obtain a summing data, and latches the summing data to output an output data according to one of a plurality of amplified data strobe signals. The data strobe signal receiver receives a data strobe signal, and generates the plurality of amplified data strobe signals by dividing a frequency of the data strobe signal.

20 Claims, 5 Drawing Sheets

(56)                    References Cited

U.S. PATENT DOCUMENTS

| | | |
|---|---|---|
| 12,154,634 B2 * | 11/2024 | Betser .................... G11C 16/32 |
| 2020/0105319 A1 | 4/2020 | Mostofa et al. |
| 2023/0033286 A1 | 2/2023 | Woo et al. |
| 2023/0214669 A1 | 7/2023 | Wang et al. |

OTHER PUBLICATIONS

Kambiz Kaviani et al., "A Tri-Modal 20-Gbps/Link Differential/ DDR3/GDDR5 Memory Interface", IEEE Journal of Solid-State Circuits, Mar. 5, 2012, pp. 926-937.

* cited by examiner

SIGNAL RECEIVER, DATA RECEIVER AND DATA LATCH THEREOF

BACKGROUND OF THE INVENTION

Technical Field

The present invention generally relates to a signal receiver, a data receiver and a data latch thereof, and more particularly to the signal receiver which can meet JEDEC (Solid State Technology Association) standard.

Description of Related Art

Since a decision feedback equalization (DFE) structure has been added into a circuit structure of double data rate fifth-generation synchronous dynamic random-access memory (DDR5 DRAM). For solving problem for a refection effect of a system, according to the JEDEC specification, the DFE structure should be applied in a strobe signal generator of the signal receiver. Such as that, a propagation delay between the data receiver a data strobe signal receiver is made large, and the data signal received by the data receiver should be a small signal. Such as that, a conventional circuit structure of a signal receiver of DRAM cannot match a requirement of the specification of JEDEC for DDR5. A new circuit structure for the signal receiver should be provided.

SUMMARY OF THE INVENTION

The present invention provides a signal receiver can be applied to a dynamic random access memory (DRAM) device. The signal receiver includes a data receiver and a data strobe signal receiver. The data receiver includes a plurality of current mode logic circuits and a plurality of data latches. The plurality of current mode logic circuits are coupled in series, wherein a first stage current mode logic circuit receives a data signal, and a final stage current mode logic circuit outputs an amplified data signal. The plurality of data latches are coupled to the final stage current mode logic circuit to receive the amplified data signal, wherein each of the data latches sums the amplified data signal and a plurality of feedback data to obtain a summing data, and latches the summing data to output an output data according to one of a plurality of amplified data strobe signals. The data strobe signal receiver receives a data strobe signal, and generates the plurality of amplified data strobe signals by dividing a frequency of the data strobe signal.

The data latch can be applied to a data receiver of a DRAM device. The data latch includes a first latch circuit, a differential pair, a current source, a plurality of first DFE summers, a plurality of second DFE summers and a second latch circuit. The differential pair has a first differential end and a second differential end respectively coupled to two ends of the first latch circuit, wherein the differential pair receives a first signal and a second signal, and the first signal and the second signal are a differential signal pair. The current source is coupled to a common end of the differential pair, and draws a common current from the common end according to a first bias voltage. The first DFE summers are coupled to the first differential end, and draw a first bias current from the first differential end according to the plurality of feedback data. The second DFE summers are coupled to the second differential end, and draw a second bias current from the second differential end according to the plurality of feedback data. The second latch circuit is coupled to two inverted ends of the first latch circuit, and obtains the corresponding output data according to two inverted output signals on the two inverted ends.

The data receiver can be applied to a DRAM device. The data receiver includes a plurality of current mode logic circuits and a plurality of data latches as mentioned above. The current mode logic circuits are coupled in series, wherein a first stage current mode logic circuit receives a data signal, and a final stage current mode logic circuit outputs an amplified data signal. The data latches are coupled to the final stage current mode logic circuit to receive the amplified data signal. Each of the data latches sums the amplified data signal and a plurality of feedback data to obtain a summing data, and latches the summing data to output an output data according to one of a plurality of amplified data strobe signals.

In summary, the data receiver of present disclosure includes a plurality of current mode logic (CML) circuits to amplify data signal to meet a data input swing request for JEDEC. Furthermore, the data receiver can improve a maximum time difference between a data request signal and the data signal (tRX_DQS2DQ) by increasing a propagation delay of the data signal.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
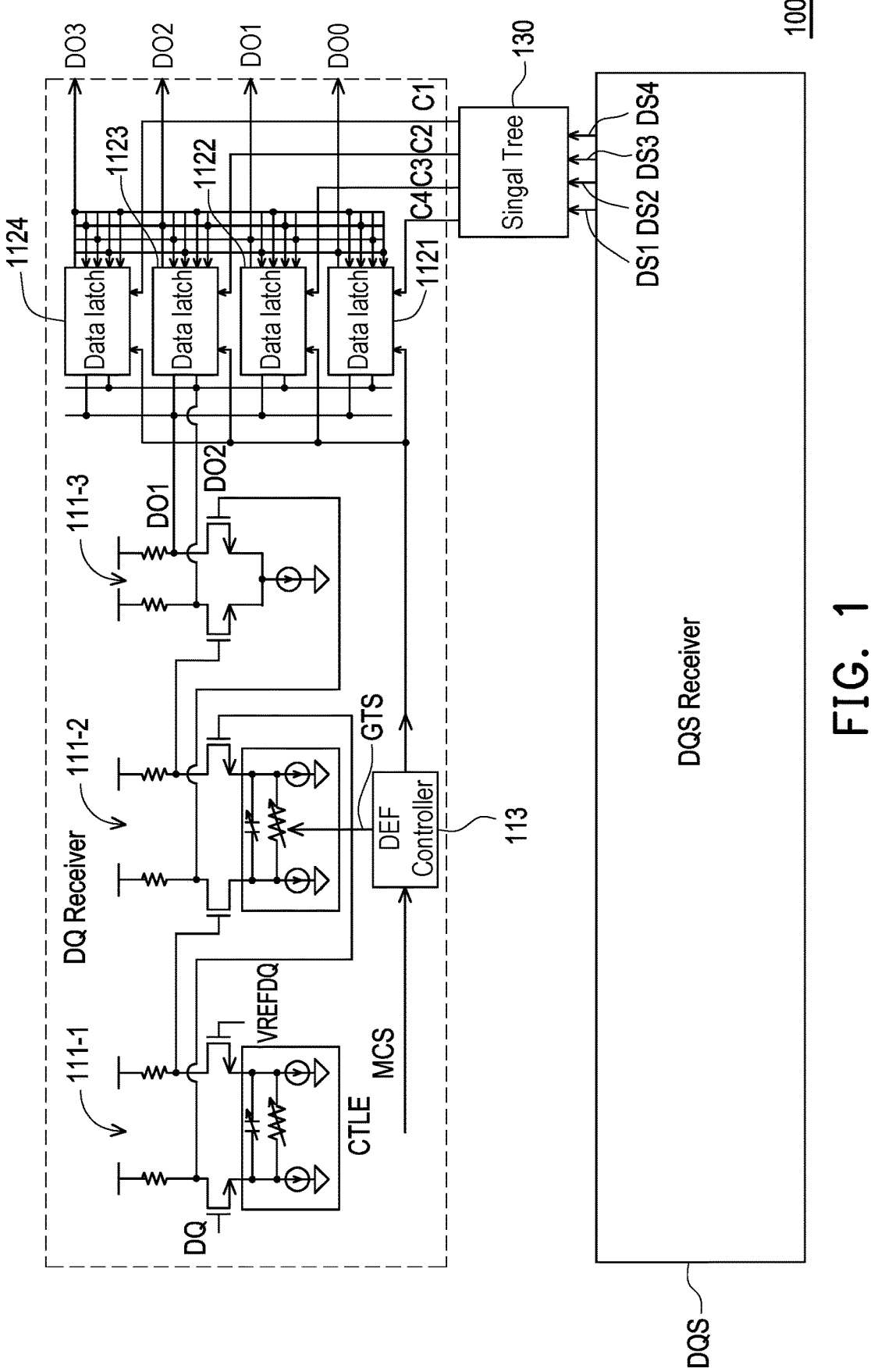
FIG. 1 illustrates a schematic diagram of a signal receiver according to an embodiment of present disclosure.

Reference will now be made in detail to the present preferred embodiment of the invention, examples of which are illustrated in the accompanying drawings. Wherever possible, the same reference numbers are used in the drawings and the description to refer to the same or like parts.

Please refer to FIG. 1, which illustrates a schematic diagram of a signal receiver according to an embodiment of present disclosure. The signal receiver 100 includes data (DQ) receiver 110, a data strobe signal (DQS) receiver and a signal tree 130. The DQ receiver 110 includes a plurality of current mode logic (CML) circuits 111-1~111-3, a plurality of data latches 1121~1124 and a decision feedback equalization (DFE) controller 113. The CML circuits 111-1~111-3 are coupled in series. The first stage CML circuit 111-1 in receives the data signal DQ by a first input end, and receives a reference data signal VREFDQ by a second input end. The CML circuits 111-1 to 111-3 amplify the data signal DQ stage by stage, and the last stage CML circuit 111-3 may generate amplified data signals DO1 and DO2, wherein the amplified data signal DO1 is inverted to the amplified data signal DO2. The data latches 1121 to 1124 are coupled in parallel and receive the amplified data signals DO1 and DO2 commonly. The data latches 1121 to 1124 respectively receive latch signals C1 to C4, and each of the data latches sums the amplified data signals DO1 and DO2 and a plurality of feedback data to obtain a summing data. Each of the data latches 1121 to 1124 further latches the corresponding summing data to output each of output data DO0-DO3 according to each of the latch signals C1 to C4. In this embodiment, phases of the latch signals C1 to C4 are different, the latch signals C1 and C2 have a phase difference of 90 degree; the latch signals C2 and C3 have a phase difference of 90 degree; and the latch signals C3 and C4 have a phase difference of 90 degree.

Each of the feedback data are generated by each of the output data DO0-DO3. In detail, take the data latch 1121 as an example, the output data DO0 of the data latch 1121 may be feedback to the data latches 1121 to 1124 to be the feedback data of the data latches 1121 to 1124. The data latch 1121 also receives the output data DO0 to DO3 to be the feedback data thereof.

In present disclosure, each of the CML circuits 111-1~111-3 may be formed by a differential pair, resistors and at least one current source. The first stage CML circuit 111-1 may be a continuous time linear equalizer (CTLE) for compensating a low pass channel effect. The middle stage CML circuit 111-2 may be coupled to the DFE controller 113, and an amplify gain of the middle stage CML circuit 111-2 may be adjusted by a gain tuning signal GTS provided by the DFE controller 113. In this embodiment, the DFE controller 113 may receive a setting code MCS, and generates the gain tuning signal GTS according to the setting code MCS. The setting code MCS can be provided by an external electronic device, and may be pre-stored in a storage device in advanced. Furthermore, the setting code MCS may be dynamic adjusted by necessary. Moreover, an amplify gain of the final stage CML circuit 111-3 may be fixed.

Please be noted here, the CML circuits 111-1~111-3 form an amplify string to amplify the data signal DQ for generating the amplified data signals DO1 and DO2. Such as that, a voltage swing of the data signal DQ can be minimized, and a specification of JEDEC for a minimum swing requirement of inputted data signal can be met. On the other hand, the amplify string also provides a propagation delay for transmitting the data signal DQ, and a maximum time difference between the data strobe signal DQS and the data signal DQ may be improved.

In other embodiment, a stage number of the CML circuits in the amplify string can be adjusted, and not limited to three. The three CML circuits 111-1 to 111-3 in FIG. 1 are only example for illustration, and not used to limit the scope of present disclosure.

The latch signals C1 to C4 are generated by the signal tree 130. The signal tree 130 receives amplified data strobe signals DS1 to DS4 from the DQS receiver 120, and generates the latch signals C1 to C4 by buffering the amplified data strobe signals DS1 to DS4, respectively. The DQS receiver 120 is coupled to the signal tree 130, receives a data strobe signal DQS and generates the amplified data strobe signals DS1 to DS4 by amplifying the data strobe signal DQS, where the amplified data strobe signals DS1 to DS4 are 4-phase quadrature signals.

Figure 2:
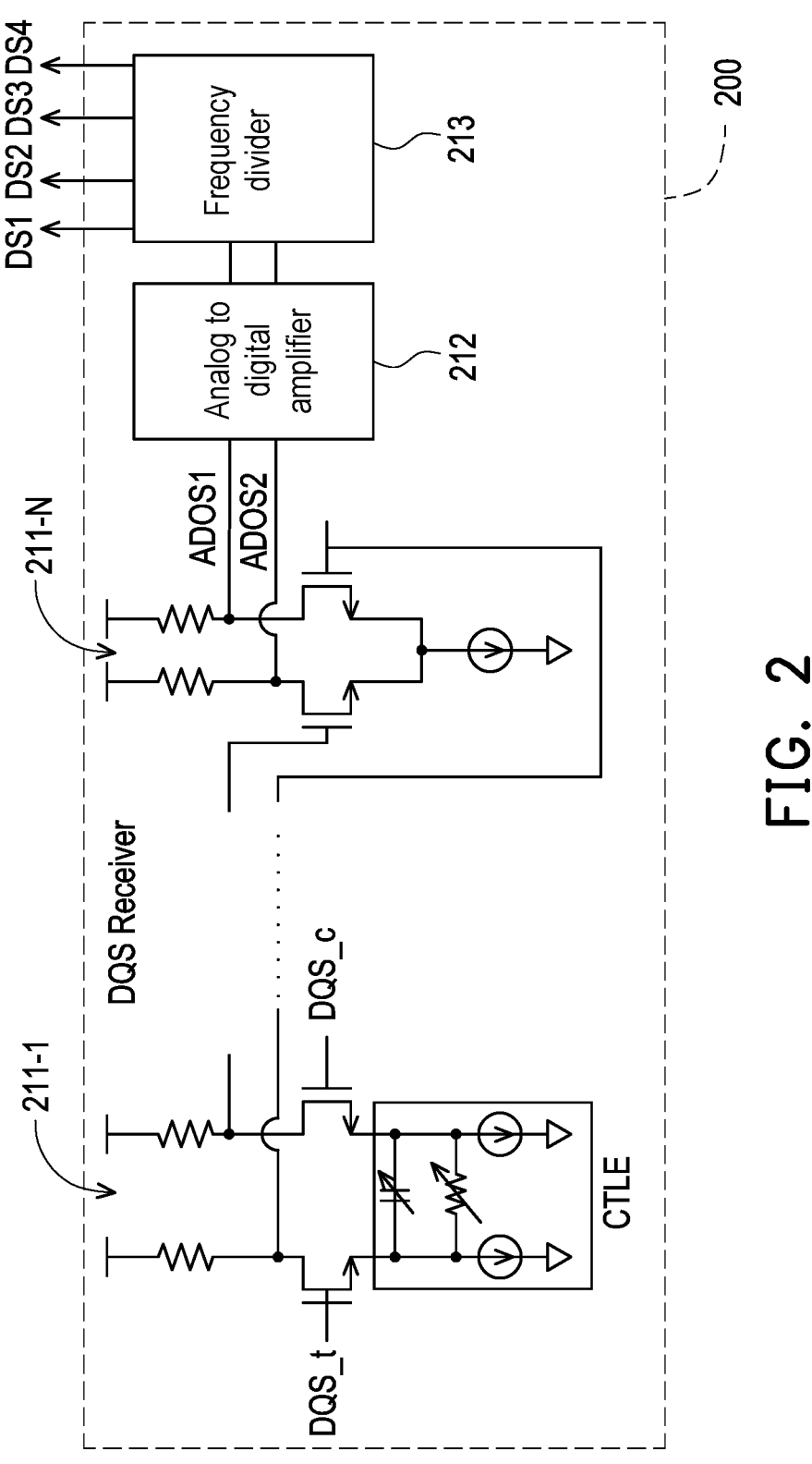
FIG. 2 illustrates a circuit diagram of a DQS receiver according to an embodiment of present disclosure.

Please refer to FIG. 2, which illustrates a circuit diagram of a DQS receiver according to an embodiment of present disclosure. The DQS receiver 200 includes a plurality of CML circuits 211-1 to 211-N, an analog to digital amplifier 212 and a frequency divider 213. The CML circuits 211-1 to 211-N are coupled in series. The first stage CML circuit 211-1 receives a data request signal pair including data request signals DQS_t and DQS_c which are complementary to each other. The first stage CML circuit 211-1 may be a CTLE circuit. The CML circuits 211-1 to 211-N form an amplify string to amplify the data request signals DQS_t and DQS_c and generate amplified data request signals ADOS1 and ADOS2.

The analog to digital amplifier 212 is coupled to the final stage CML circuit 211-N, and converts the amplified data request signals ADOS1 and ADOS2 from analog format to digital format. The frequency divider 213 is coupled to the analog to digital amplifier 212, and generates the amplified data strobe signals DS1 to DS4 by dividing a frequency of at least one of the amplified data request signals ADOS1 and ADOS2 with digital format. The frequency divider 213 may divide the frequency of the amplified data request signals ADOS1 and ADOS2 by 2. In this embodiment, the amplified data strobe signals DS1 to DS4 may respectively has four different phases and the amplified data strobe signals DS1 to DS4 are half frequency signals.

Figure 3:
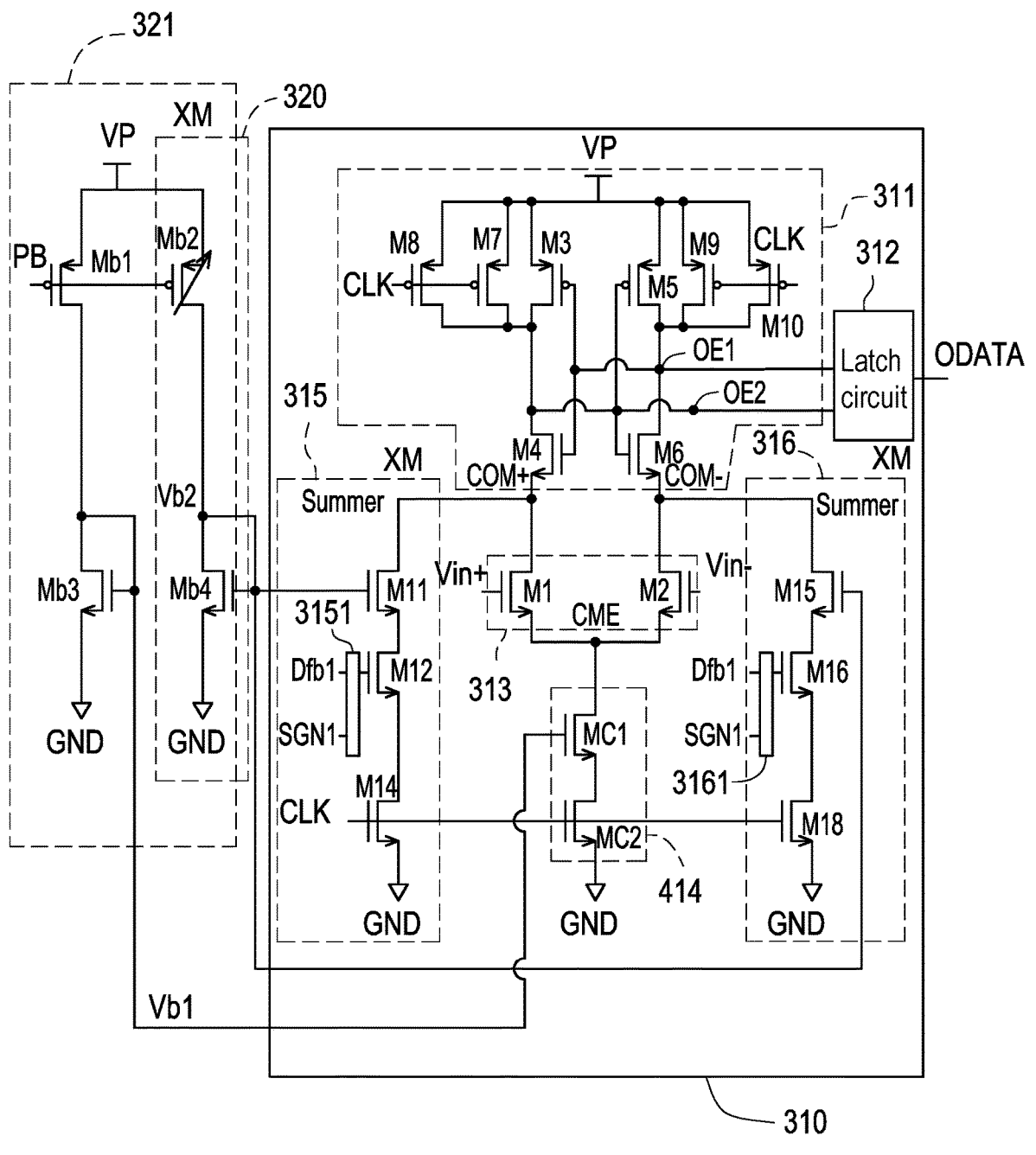
FIG. 3 illustrates a circuit diagram of a part of a signal latch according to an embodiment of present disclosure.

Please refer to FIG. 3, which illustrates a circuit diagram of a part of a signal latch according to an embodiment of present disclosure. The signal latch 300 includes a data latch 310 and a bias voltage generator 320. The data latch 310 includes latch circuits 311 and 312, a differential pair 313, a current source 314, a plurality of first DFE summers 315 and a plurality of second DFE summers 316. The latch circuit 311 includes transistors M3 to M10. The transistors M3 and M4 are coupled in series between a power voltage VP and a reference ground voltage GND to form a first inverter. The transistors M5 and M6 are coupled in series between the power voltage VP and the reference ground voltage GND to form a second inverter. The input end (control ends of the transistors M3 and M4) of the first inverter is coupled to an output end (a second end of the transistor M5 and a first end of the transistor M6) of the second inverter. The input end (control ends of the transistors M5 and M6) of the second inverter is coupled to the output end (a second end of the transistor M3 and a first end of the transistor M4) of the first inverter. A second end of the transistor M4 and a second end of the transistor M6 are respectively coupled to differential ends com− and com+ of the differential pair 313. Furthermore, the transistors M7 and M8 are coupled to the transistor M3 in parallel, and controlled by a clock signal CLK. The transistors M9 and M10 are coupled to the transistor M5 in parallel, and controlled by the clock signal CLK. The transistors M7 to M10 are pull up transistors which are used to pull outputs of the latch circuit 311 to the power voltage VP when the clock signal CLK is at logic low. When the clock signal CLK is at logic high, the two output signals OE1 and OE2 of the latch circuit 311 are differential signals, and the latch circuit 311 may latch signals on the two differential ends com− and com+ to generated the output signals on two inverted output ends OE1 and OE2.

Output ends OE1 and OE2 of the latch circuit 311 are coupled to the latch circuit 312. The latch circuit 312 latches the output signal of the larch circuit 311 to generate output data ODATA.

The differential pair 313 includes transistors M1 and M2. A first end of the transistor M1 is coupled to the differential end com− and a second end of the transistor M1 is coupled to a common end CME of the differential pair 313, and a control end of the transistor M1 receives an input signal Vin+. A first end of the transistor M2 is coupled to the differential end com+ and a second end of the transistor M2 is coupled to the common end CME of the differential pair

313, and a control end of the transistor M2 receives an input signal Vin–. Wherein, the input signals Vin+ and Vin– may be the amplified data signals provided by a plurality of CML circuits in a data receiver of a DRAM.

The current source 314 includes transistors MC1 and MC2, and the transistors MC1 and MC2 are coupled in series between the common end CME and the reference ground voltage GND. The transistor MC2 is controlled by the clock signal CLK. The transistor MC1 is controlled by a bias voltage Vb1.

The first DFE summers 315 are coupled to first differential end com–, and the second DFE summers 316 are coupled to second differential end com+. A number of the first DFE summers 315 can be determined by a tap number. In this embodiment, the number of the first DFE summers 315 may equal M, where M is a positive integer. Furthermore, a number of the second DFE summers 316 equals to the number of the first DFE summers 315. The M first DFE summers 315 are respectively corresponding to a plurality of feedback data (for example, the first feedback data to a Mth feedback data), and the M second DFE summers 316 are respectively corresponding to the plurality of feedback data (for example, the first feedback data to the Mth feedback data), too.

Each of the first DFE summers 315 includes transistors M11 to M14. The transistors M11 to M14 are coupled in series between the first differential end com– and the reference ground voltage GND. In the first DFE summer 315 of a first stage, the transistor M11 is controlled by a bias voltage Vb2. The transistor M12 is controlled by an output signal of a logic gate 3151, and the transistor M14 is controlled by the clock signal CLK. Wherein, the logic gate 3151 receives a feedback data Dfb1 and a sign information SGN1 of feedback data Dfb1, and the logic gate 3151 may be an XNOR gate. The first DFE summers 315 are used to draw a bias current from the first differential end com– according to the plurality of feedback data Dfb1. Each of the second DFE summers 316 includes transistors M15 to M18. In the second DFE summer 316 of a first stage, the transistors M15 to M18 are coupled in series between the second differential end com+ and the reference ground voltage GND. The transistor M15 is controlled by the bias voltage Vb2. The transistor M16 is controlled by an output signal of a logic gate 3161, and the transistor M18 is controlled by the clock signal CLK. Wherein, the logic gate 3161 receives the feedback data Dfb1 and the sign information SGN1 of feedback data Dfb1, and the logic gate 3161 may be an XOR gate. The second DFE summers 316 are used to draw a bias current from the second differential end com+ according to the plurality of feedback data Dfb1.

On the other hand, the bias voltage generator 320 is coupled to the data latch 310, and the bias voltage generator 320 is used to provide the bias voltage Vb1 and Vb2 to the data latch 310. The bias voltage generator 320 includes transistors Mb1 to Mb4. The transistors Mb1 and Mb3 are coupled in series between the power voltage VP and the reference ground voltage GND. The transistor Mb1 is controlled by a bias voltage PB. A control end and a first end of the transistor Mb3 are coupled together to generate the bias voltage Vb1. The transistors Mb2 and Mb4 are coupled in series between the power voltage VP and the reference ground voltage GND. The transistor Mb2 is controlled by a bias voltage PB. A control end and a first end of the transistor Mb4 are coupled together to generate the bias voltage Vb2. It should be noted here, a current of the transistor Mb2 can be adjusted according to a setting code. The setting code can be recorded in a mode register of a memory device. The current of the transistor Mb2 flows through the transistor Mb4 to establish the bias voltage Vb2. That is, the bias voltage Vb2 can be programmed according to the setting code.

Please be noted here, a number of sub-circuits 321 formed by the transistors Mb2 and Mb4 may equal M. That is, the number of the sub-circuits 321 is same as the number of the first DFE summers 315, and is also same as the number of the second DFE summers 316.

Please be noted here, during an operation, both the transistor M11 and M15 may be turned on simultaneously.

In additional, in present disclosure, one bias voltage generator 320 can be shared by a plurality of signal latches as the signal latch 300 to save a circuit size. For example, one bias voltage generator 320 may be shared by 4 signal latches.

Figure 4A:
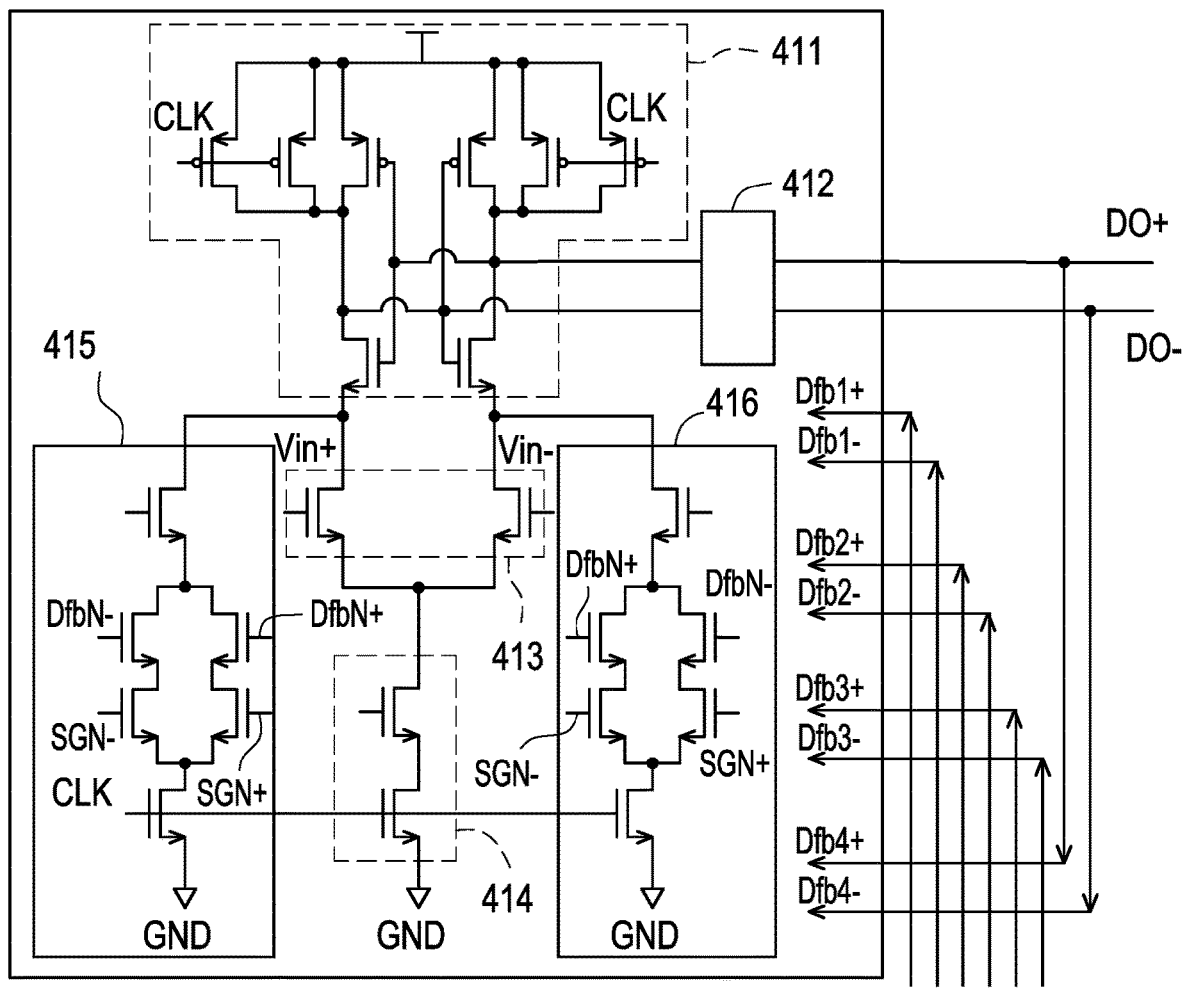
FIG. 4A and FIG. 4B illustrate a schematic diagram of a data latch of a signal receiver in a DRAM device according to an embodiment of present disclosure.
Figure 4B:
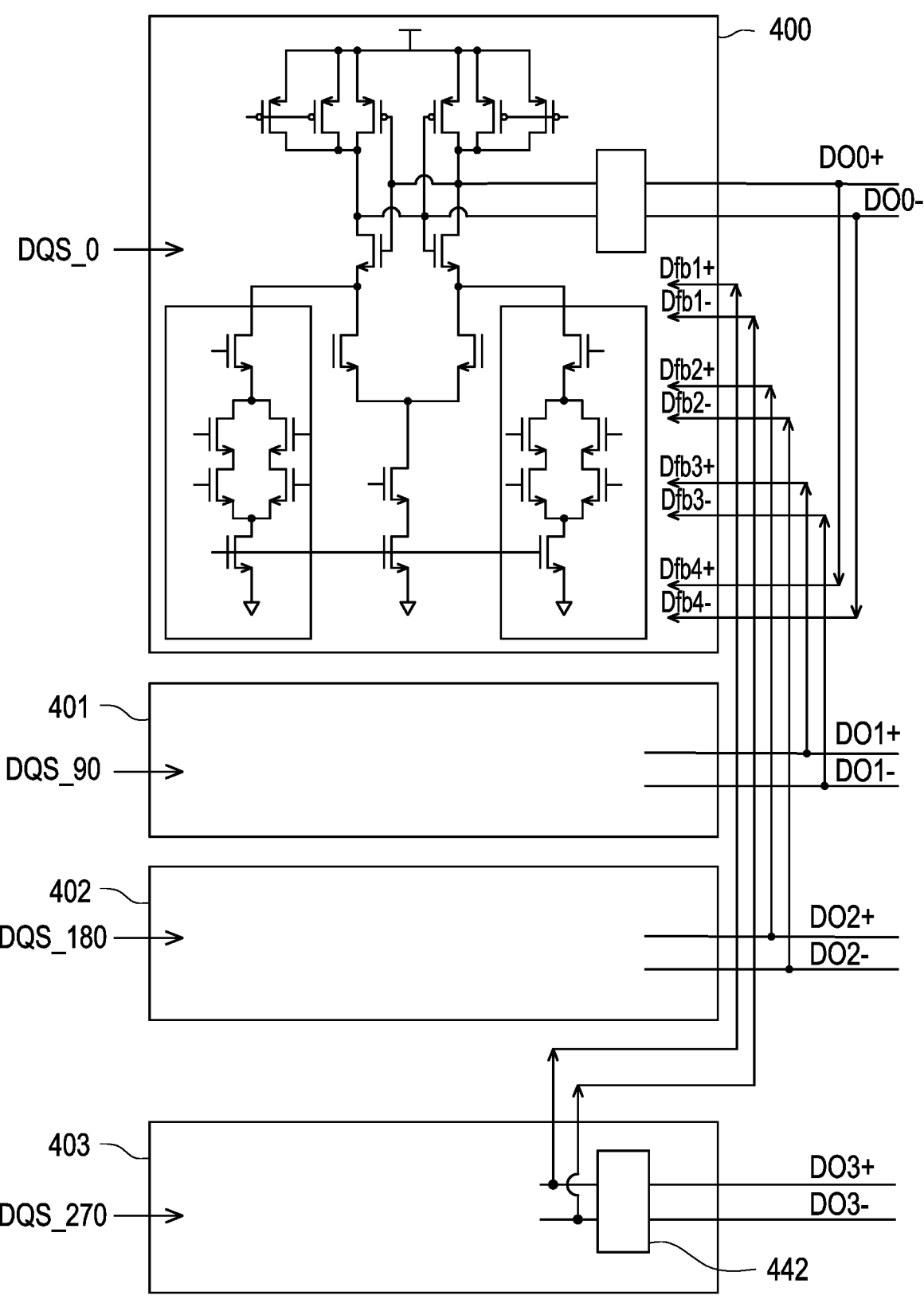

Please refer to FIG. 4A and FIG. 4B, which illustrate a schematic diagram of a data latch of a signal receiver in a DRAM device according to an embodiment of present disclosure. In FIG. 4A, the data latch 400 includes latches 411 and 412, a differential pair 413, a current source 414, a plurality of first DFE summers 415 and a plurality of second DFE summers 416. In here, detail circuits of the latches 411 and 412, the differential pair 413, the current source 414, the plurality of first DFE summers 415 and the plurality of second DFE summers 416 have been described in the embodiment of FIG. 3, and no more repeated description here.

It should be noted here, output signals DO+ and DO– generated by the latch circuit 412 may be feedback to generate feedback data Dfb4+ and Dfb4–, respectively. Also, the data latch 400 may receive other output signals from other data latch to obtain feedback data Dfb1+ to Dfb3+ and Dfb1– to Dfb3–. Wherein the output signals DO+ and DO– are differential signal pair, the feedback data Dfb1+ and Dfb1–, Dfb2+ and Dfb2– and Dfb3+ and Dfb3– are all differential signal pair.

The feedback data Dfb1+ to Dfb4+ and Dfb1– to Dfb4– and corresponding sign information may be inputted to the first DFE summers 415 and the second DFE summers 416, respectively. In this embodiment, number of the first summers 415 may be four, and number of the second summers 416 may be four, too. The four first summers 415 and the four second summers 416 are respectively corresponding to the feedback data Dfb1+ to Dfb4+ and Dfb1– to Dfb4–. In FIG. 4B, transistors of one of the first summer 415 respectively receive the feedback data DfbN+, DfbN– and corresponding sign information SGN+ and SGN–. Transistors of one of the second summer 416 respectively receive the feedback data DfbN+, DfbN– and corresponding sign information SGN+ and SGN–. Wherein, N may be from 1 to 4. Such as that, the first summers 415 and the second summers 416 may share one bias voltage generator as the bias voltage generator 320 in FIG. 3, and circuit size can be saved.

In FIG. 4B, a plurality of data latches 400 to 403 are illustrated. A circuit structure of each of the data latches 401 to 403 is similar to a circuit structure of the data latch 400, and details of the circuit structure of the data latch 400 has been described in the embodiment of FIG. 4A, and no more descriptions here. In FIG. 4B, the data latches 400 to 403 respectively receive data strobe signals DQS_0, DQS_90, DQS_180 and DQS 270. There is a phase difference of 90 degree between the data strobe signals DQS_0 and DQS_90; there is a phase difference of 90 degree between the data strobe signals DQS_90 and DQS_180; there is a phase difference of 90 degree between the data strobe signals DQS_180 and DQS_270; and there is a phase difference of 90 degree between the data strobe signals DQS_270 and DQS_0.

On the other hand, the data latch 400 provides output signals DO0+ and DO0−; the data latch 401 provides output signals DO1+ and DO1−; the data latch 402 provides output signals DO2+ and DO2−; the data latch 403 provides output signals DO3+ and DO3−. The output signals DO0+ to DO3+ respectively form a plurality of output signal pairs with the output signals DO0− to DO3−, wherein each of the output signal pair is a differential signal pair. There is a phase difference of 90 degree between the output signals DO0+ and DO1+; there is a phase difference of 90 degree between the output signals DO1+ and DO2+; there is a phase difference of 90 degree between the output signals DO2+ and DO3+; and there is a phase difference of 90 degree between the output signals DO3+ and DO0+0. Furthermore, in presented disclosure, in presented disclosure, the data latch 400 may feedback the output signals DO0+ and DO0− to itself to form feedback signals Dfb4+ and Dfb4−; the data latch 401 may feedback the output signals DO1+ and DO1− to the data latch 400 to form feedback signals Dfb3+ and Df3−; the data latch 402 may feedback the output signals DO2+ and DO2− to the data latch 400 to form feedback signals Dfb2+ and Df2−. It should be noted here, the data latch 403 may not feedback the output signals DO3+ and DO3− to the data latches 400 to 402 to form the feedback signals Dfb1+ and Dfb1− directly. In this embodiment, the data latch 403 is a last stage data latch, and the data latch 403 may feedback signals inputted to a latch circuit 442 for generating the output signals DO3+ and DO3− to form feedback signals Dfb1+ and Dfb1−. The signals inputted to the latch circuit 442 are two inverted output signals generated by a latch circuit of the data latch 403.

The feedback signals Dfb1+ to Dfb4+ and Dfb1− to Dfb4− may be transmitted to summers of the data latch 400.

It should be noted here, the data latches 400 to 403 also provide the feedback signals Dfb1+ to Dfb4+ and Dfb1− to Dfb4− to each of the data latched 401 to 403 by the same manner shown as FIG. 4B.

In summary, in the presented disclosure, a plurality of CML circuits are disposed in the data receiver of the signal receiver to amplify the data signal. Furthermore, the CML circuits in the data receiver provides a propagation delay for transmitting the amplified data signal. Such as that, a specification of JEDEC standard for DDR5 DRAM can be met.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A signal receiver, comprising:
   a data receiver, comprising:
      a plurality of current mode logic circuits, coupled in series, wherein a first stage current mode logic circuit receives a data signal, and a final stage current mode logic circuit outputs an amplified data signal; and
      a plurality of data latches, coupled to the final stage current mode logic circuit to receive the amplified data signal, wherein each of the data latches sums the amplified data signal and a plurality of feedback data to obtain a summing data, and latches the summing data to output an output data according to one of a plurality of frequency-divided data strobe signals; and
   a data strobe signal receiver, receiving a data strobe signal, and generating the plurality of frequency-divided data strobe signals by dividing a frequency of the data strobe signal.

2. The signal receiver according to claim 1, wherein the current mode logic circuits comprise a plurality of first current mode logic circuits and a second current mode logic circuit,
   wherein at least one of the first current mode logic circuits adjusts an amplify gain according to a gain tuning signal, an amplify gain of the second current mode logic circuit is fixed, and the second current mode logic circuit is the final stage current mode logic circuit.

3. The signal receiver according to claim 2, wherein the data receiver further comprises:
   a decision feedback equalization (DFE) controller, generating the gain tuning signal according to a setting code.

4. The signal receiver according to claim 1, wherein the plurality of frequency-divided data strobe signals respectively having a plurality of different phases.

5. The signal receiver according to claim 1, wherein each of the data latches comprises:
   a first latch circuit;
   a differential pair, having a first differential end and a second differential end respectively coupled to two ends of the first latch circuit, wherein the differential pair receives the amplified data signal and an inverted amplified data signal;
   a current source, coupled to a common end of the differential pair, drawing a common current from the common end according to a first bias voltage;
   a plurality of first DFE summers, coupled to the first differential end, drawing a first bias current from the first differential end according to the plurality of feedback data;
   a plurality of second DFE summers, coupled to the second differential end, drawing a second bias current from the second differential end according to the plurality of feedback data; and
   a second latch circuit, coupled to the first latch circuit, and obtaining the corresponding output data according to the output from the first latch circuit.

6. The signal receiver according to claim 5, wherein one of the first DFE summers and the second DFE summers comprises:
   a first transistor, having a first end coupled to the first differential end or the second differential end, a control end of the first transistor receiving a second bias voltage;
   a logical gate, receiving one of the first feedback data and corresponding sign information;
   a second transistor, having a first end coupled to a second end of the first transistor, a control end of the second transistor is coupled to an output end of the logical gate; and
   a third transistor, coupled between a second end of the second transistor and the reference ground end, and controlled by a clock signal.

7. The signal receiver according to claim 5, wherein each of the first DFE summer comprises:

a first transistor, having a first end coupled to the first differential end or the second differential end, a control end of the first transistor receiving a second bias voltage;

a second transistor and a third transistor coupled in series, wherein the second transistor having a first end coupled to the second end of the first transistor, a control end of the second transistor receiving a first feedback data, a control end of the third transistor receives a first sign information corresponding to the first feedback data;

a fourth transistor and a fifth transistor coupled in series, wherein the fourth transistor having a first end coupled to the second end of the first transistor, a control end of the fourth transistor receiving a second feedback data, a control end of the fifth transistor receives a second sign information corresponding to the second feedback data, wherein the second feedback data is inverted to the first feedback data; and a sixth transistor, coupled between a second end of the third transistor and the reference ground end, and controlled by a clock signal.

8. The signal receiver according to claim 5, wherein each of the second DFE summer comprises:

a first transistor, having a first end coupled to the first differential end or the second differential end, a control end of the first transistor receiving a second bias voltage;

a second transistor and a third transistor coupled in series, wherein the second transistor having a first end coupled to the second end of the first transistor, a control end of the second transistor receiving a first feedback data, a control end of the third transistor receives a second sign information corresponding to a second feedback data;

a fourth transistor and a fifth transistor coupled in series, wherein the fourth transistor having a first end coupled to the second end of the first transistor, a control end of the fourth transistor receiving the second feedback data, a control end of the fifth transistor receives a first sign information corresponding to the first feedback data, wherein the second feedback data is inverted to the first feedback data; and a sixth transistor, coupled between a second end of the third transistor and the reference ground end, and controlled by a clock signal.

9. The signal receiver according to claim 7, further comprising:

a bias voltage generator, generating the first bias voltage and the second bias voltage.

10. The signal receiver according to claim 8, wherein the bias voltage generator comprises:

a seventh transistor, having a first end receiving a power voltage, and a control end of the seventh transistor receiving a third bias voltage;

at least one eighth transistor, coupled with the seventh transistor in parallel;

a nineth transistor, coupled between a second end of the eighth transistor and the reference ground end, a control end of the nineth transistor being coupled to the second end of the eighth transistor to output the second bias voltage; and at least one tenth transistor, coupled between a second end of the seventh transistor and the reference ground end, a control end of the tenth transistor being coupled to the second end of the seventh transistor to output the first bias voltage, wherein a current of the eighth transistor is controlled according to a setting code.

11. The signal receiver according to claim 1, wherein one of the data latches provides one of the feedback data to all the data latches according to the corresponding output data.

12. The signal receiver according to claim 11, wherein each of the data latches comprises:

a first latch circuit; and a second latch circuit, coupled to the first latch circuit, and obtaining the corresponding output data according to the output from the first latch circuit;

wherein a last stage of the data latch provides the output signals from the first latch circuit to be the corresponding feedback data, other stages of the data latches provide the corresponding output data from the second latch circuit to be the corresponding feedback data.

13. A data latch, applied to a data receiver, wherein the data latch comprises:

a first latch circuit;

a differential pair, having a first differential end and a second differential end respectively coupled to two ends of the first latch circuit, wherein the differential pair receives a first signal and a second signal, and the first signal and the second signal are a differential signal pair;

a current source, coupled to a common end of the differential pair, drawing a common current from the common end according to a first bias voltage;

a plurality of first DFE summers, coupled to the first differential end, drawing a first bias current from the first differential end according to the plurality of feedback data;

a plurality of second DFE summers, coupled to the second differential end, drawing a second bias current from the second differential end according to the plurality of feedback data; and a second latch circuit, coupled to the first latch circuit, and obtaining the corresponding output data according to the output from the first latch circuit.

14. The data latch according to claim 13, wherein one of the first DFE summers and the second DFE summers comprises:

a first transistor, having a first end coupled to the first differential end or the second differential end, a control end of the first transistor receiving a second bias voltage;

a logical gate, receiving one of the first feedback data and corresponding sign information;

a second transistor, having a first end coupled to a second end of the first transistor, a control end of the second transistor is coupled to an output end of the logical gate; and a third transistor, coupled between a second end of the second transistor and the reference ground end, and controlled by a clock signal.

15. The data latch according to claim 14, wherein the logical gate in each of the first DFE summers is an XNOR gate.

16. The data latch according to claim 14, wherein the logical gate in each of the second DFE summers is an XOR gate.

17. The data latch according to claim 13, wherein each of the first DFE summers comprises:

a first transistor, having a first end coupled to the first differential end or the second differential end, a control end of the first transistor receiving a second bias voltage;

a second transistor and a third transistor coupled in series, wherein the second transistor having a first end coupled to the second end of the first transistor, a control end of the second transistor receiving a first feedback data, a control end of the third transistor receives a first sign information corresponding to the first feedback data;

a fourth transistor and a fifth transistor coupled in series, wherein the fourth transistor having a first end coupled to the second end of the first transistor, a control end of the fourth transistor receiving a second feedback data, a control end of the fifth transistor receives a second sign information corresponding to the second feedback data, wherein the second feedback data is inverted to the first feedback data; and a sixth transistor, coupled between a second end of the third transistor and the reference ground end, and controlled by a clock signal.

18. The data latch according to claim 13, wherein each of the second DFE summer comprises:

a first transistor, having a first end coupled to the first differential end or the second differential end, a control end of the first transistor receiving a second bias voltage;

a second transistor and a third transistor coupled in series, wherein the second transistor having a first end coupled to the second end of the first transistor, a control end of the second transistor receiving a first feedback data, a control end of the third transistor receives a second sign information corresponding to a second feedback data;

a fourth transistor and a fifth transistor coupled in series, wherein the fourth transistor having a first end coupled to the second end of the first transistor, a control end of the fourth transistor receiving the second feedback data, a control end of the fifth transistor receives a first sign information corresponding to the first feedback data, wherein the second feedback data is inverted to the first feedback data; and a sixth transistor, coupled between a second end of the third transistor and the reference ground end, and controlled by a clock signal.

19. The data latch according to claim 17, further comprising:

a bias voltage generator, generating the first bias voltage and the second bias voltage.

20. The signal receiver according to claim 19, wherein the bias voltage generator comprises:

a seventh transistor, having a first end receiving a power voltage, and a control end of the seventh transistor receiving a third bias voltage;

at least one eighth transistor, coupled with the seventh transistor in parallel;

a nineth transistor, coupled between a second end of the eighth transistor and the reference ground end, a control end of the nineth transistor being coupled to the second end of the eighth transistor to output the second bias voltage; and at least one tenth transistor, coupled between a second end of the seventh transistor and the reference ground end, a control end of the tenth transistor being coupled to the second end of the seventh transistor to output the first bias voltage, wherein a current of the eighth transistor is controlled according to a setting code.

* * * * *